United States Patent [19]

Gabara

[11] Patent Number: 5,450,027
[45] Date of Patent: Sep. 12, 1995

[54] LOW-POWER-DISSIPATION CMOS CIRCUITS

[75] Inventor: Thaddeus J. Gabara, Murray Hill, N.J.

[73] Assignee: AT&T Corp., Murray Hill, N.J.

[21] Appl. No.: 225,950

[22] Filed: Apr. 8, 1994

[51] Int. Cl.$^6$ .......................................... H03K 19/20
[52] U.S. Cl. ........................... 326/98; 326/121; 327/544
[58] Field of Search .......... 307/296.3, 443, 451; 365/227; 326/98, 121; 327/544

[56] References Cited

U.S. PATENT DOCUMENTS 5,324,992  6/1994  Maly ........................... 307/296.3
5,329,169  7/1994  Ihara ........................... 307/296.3

OTHER PUBLICATIONS

C. L. Seitz et al, "Hot–Clock nMOS", 1985, pp. 1–17, Proceedings of the 1985 Chapel Hill Conference on VLSI, Computer Science Press.

Primary Examiner—Edward P. Westin
Assistant Examiner—Andrew Sanders

[57] ABSTRACT

A conventional CMOS inverter circuit is operated in a low-power-dissipation mode by being connected to a pulsed power supply. The circuit is utilized as a basic building block to realize a variety of logic and memory functions.

8 Claims, 5 Drawing Sheets

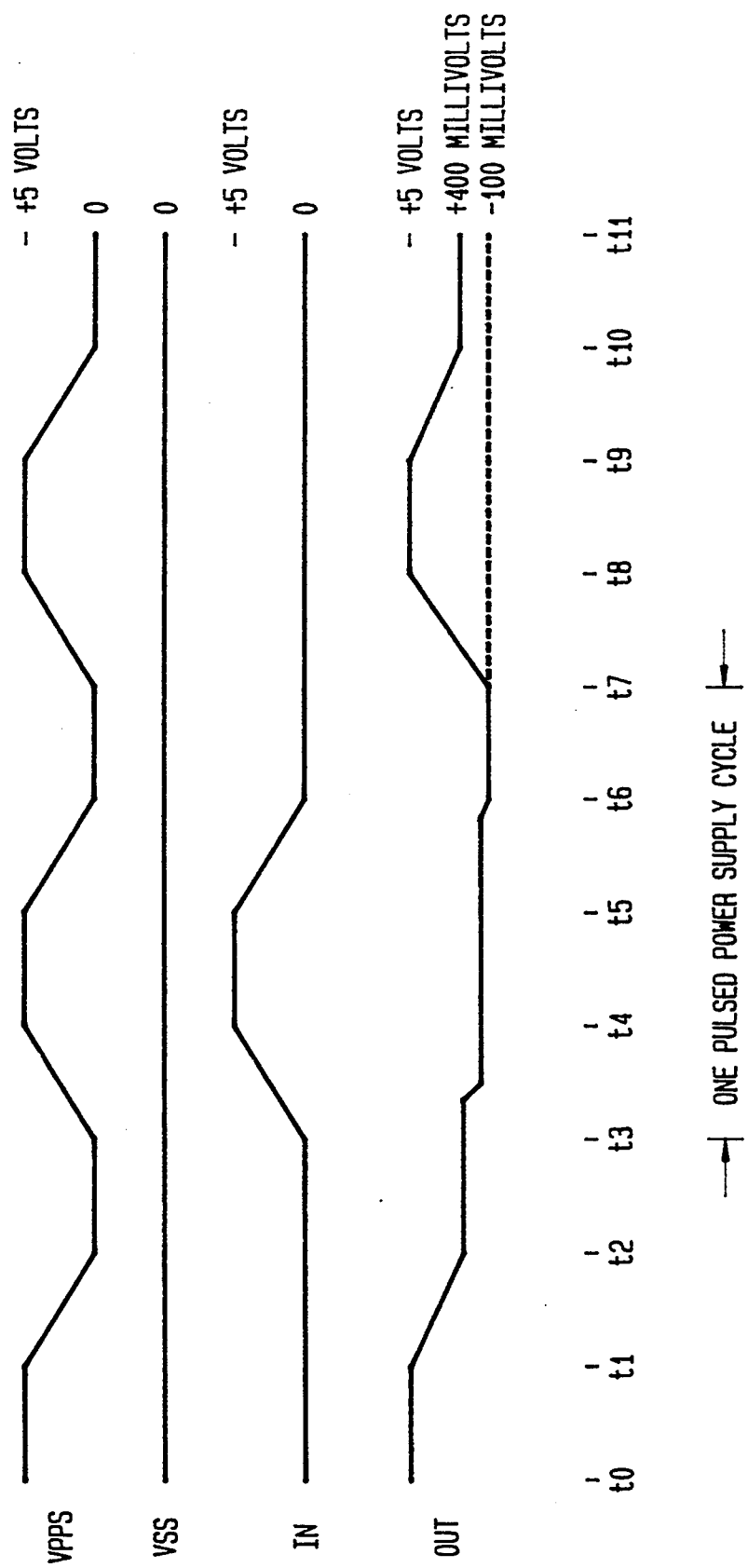

5,450,027

LOW-POWER-DISSIPATION CMOS CIRCUITS

BACKGROUND OF THE INVENTION

This invention relates to low-power-dissipation circuits and, more particularly, to low-power-dissipation circuits fabricated in integrated-circuit (IC) form utilizing complementary metal-oxide-semiconductor (CMOS) technology.

CMOS is generally the currently preferred technology for making IC chips for use in a wide variety of electronic equipment. As the trend to miniaturize such equipment has increased, the use therein of very-large-scale IC chips made in CMOS has become common. The amount of power dissipated in dense arrays of such chips is now often a critical consideration in their design.

Further, the growing importance of portable communication systems has put additional emphasis on the need to design all the component parts of the IC equipment in such systems to exhibit especially low power-dissipation characteristics. In fact, the longevity of the power supplies (batteries) included in these systems is often an important determinant of the usefulness of a system.

Heretofore, it has been proposed to operate metal-oxide-semiconductor (MOS) and CMOS chips in a so-called pulsed-power-supply mode. It was recognized that operation in that mode was a basis for providing chips characterized by low power dissipation. In this connection, see "Hot-Clock nMOS" by C. L. Seitz et al, *Proceedings of the 1985 Chapel Hill Conference on VLSI*, Computer Science Press, pages 1–17.

But prior known work directed at operating CMOS chips in a pulsed-power-supply mode has consistently specified CMOS circuit configurations that are different and considerably more complicated than the configurations of conventional CMOS circuits operated from a constant-value power supply. In other words, prior known work has not recognized the capability of at least some types of conventional CMOS circuits to operate in the pulsed-power-supply mode.

SUMMARY OF THE INVENTION

In accordance with the principles of the present invention, a conventional CMOS inverter circuit comprising a single p-channel MOS transistor connected in series with a single n-channel transistor is operated in a low-power-dissipation mode by being connected to a pulsed power supply. By connecting additional such transistors in parallel and/or in series with the aforementioned transistors included in the inverter, various low-power-dissipation configurations capable of performing logic operations or serving as a gated inverter circuit are realized. Moreover, by cross-connecting two of the basic inverter circuits, a memory cell operated from a pulsed power supply is formed. During the pulsed mode of operation, the state of the memory cell is retained in parasitic capacitances included in the cell configuration.

More specifically, in accordance with the principles of the present invention, a CMOS inverter circuit comprises a p-channel transistor and an n-channel transistor each having source, drain and gate electrodes. The gate electrodes of the two transistors are connected together and to an input terminal. The drain electrodes of the transistors are connected together and to an output terminal. At least one of the source electrodes is connected to a pulsed power supply. In a preferred embodiment, the other source electrode is connected to a point of reference potential such as ground.

In further accordance with the invention, conventional CMOS circuits operated in a pulsed-power-supply mode are switched during inactive periods to a standard constant-value power supply designed for conventional CMOS circuits. In that way, power dissipation in the circuit is minimized during inactive periods.

BRIEF DESCRIPTION OF THE DRAWING

A complete understanding of the present invention and of the above and other features and advantages thereof will be apparent from the detailed description below taken in conjunction with the accompanying drawing, in which:

FIG. 6 is a timing diagram for the inverter circuit represented in FIG. 5;

DETAILED DESCRIPTION

FIGS. 1 through 4 are intended as general background material to demonstrate the energy, and thus power, savings that can be achieved by operating an MOS transistor in a so-called pulsed-power-supply mode. As will be seen, savings are realized in this mode relative to the energy required if the power supply for the transistor were maintained at a constant value, which is the usual custom with conventional CMOS circuits.

Figure 1:
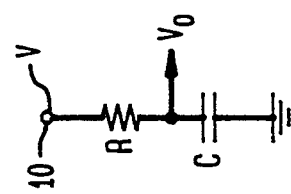
FIG. 1 is a simplified representation of a conventional MOS transistor connected between a power supply and a capacitive load.

In FIG. 1, resistor R represents an MOS transistor that has been enabled. Power supply 10 connected to the MOS transistor has a value V. When enabled, the transistor provides an output voltage $V_o$ across a load that is typically capacitive in nature. Capacitor C in FIG. 1 represents that load.

Figure 2:
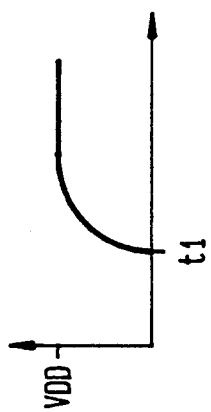
FIGS. 2 through 4 are diagrams showing the output voltage obtained across the capacitive load of FIG. 1 for various power supply conditions.

In a conventional MOS circuit, the power supply 10 of FIG. 1 has a fixed constant value VDD which is, for example, +5 volts. If, as indicated in FIG. 2, this fixed value is first applied to the FIG. 1 arrangement at the time t1 as a step voltage, the output voltage $V_o$ gradually rises to the value VDD, in a time determined by the RC time constant of the arrangement. As is well known, the energy E dissipated in the MOS transistor (resistor R) during this process is $(C) \times (VDD^2/2)$.

Figure 3:
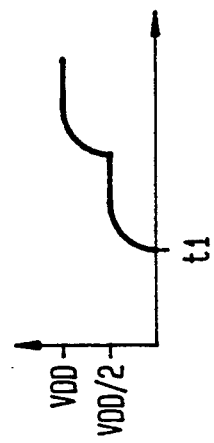

If the value of the power supply 10 connected to the resistor R of FIG. 1 is increased to its final value VDD in two equal steps, as represented in FIG. 3, the energy dissipated in the resistor R during the process of charging the capacitor C to a final value equal to VDD is $(C) \times (VDD/2)^2/2 + (C) \times (VDD/2)^2/2$ or only $(C) \times (VDD^2/4)$.

Figure 4:
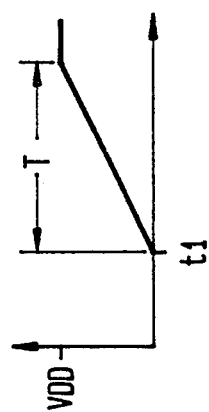

Even less energy will be dissipated in the resistor R of FIG. 1 during enablement if the power supply is raised to its final value of VDD in smaller step sizes. In the limit of small step sizes, the waveform of the power supply voltage applied to R can be represented as a ramp, as shown in FIG. 4. For such a ramp waveform, the time T required to achieve a final output voltage equal to VDD is in practice considerably greater than the aforespecified RC time constant. In that case, the energy dissipated in the resistor R is approximated by the expression $(C) \times (VDD)^2 \times (RC/T)$.

In accordance with a specific illustrative embodiment of the principles of the present invention, the power supply voltage for a conventional CMOS inverter circuit is periodically ramped up from a point of reference potential to a final voltage value VDD, in the manner represented in FIG. 4. By way of example, this ramping up process will be referred to herein as the POWER-UP phase of the power supply cycle of operation. In its subsequent or so-called VALID phase, the power supply voltage is then maintained at VDD for a prescribed interval of time. Subsequently, the power supply voltage is ramped back down to the reference potential. This occurs during the so-called POWER-DOWN phase, and the voltage then remains at the reference potential for another prescribed interval of time. The time during which the power supply remains at the reference potential will be referred to herein as the DEAD phase. Subsequently, another POWER-UP phase involving a ramp waveform is initiated.

Thus, in a complete cycle of operation characteristic of the invention, the power supply voltage applied to a conventional CMOS inverter circuit repeatedly cycles between prescribed voltage levels. Such a cycling or pulsing supply will be referred to herein as a pulsed power supply. The exact form and nature of such a supply voltage and its relationship to input signals applied to and output signals abstracted from the circuit will become apparent later below in connection with the detailed description of the timing diagram of FIG. 6.

Figure 5:
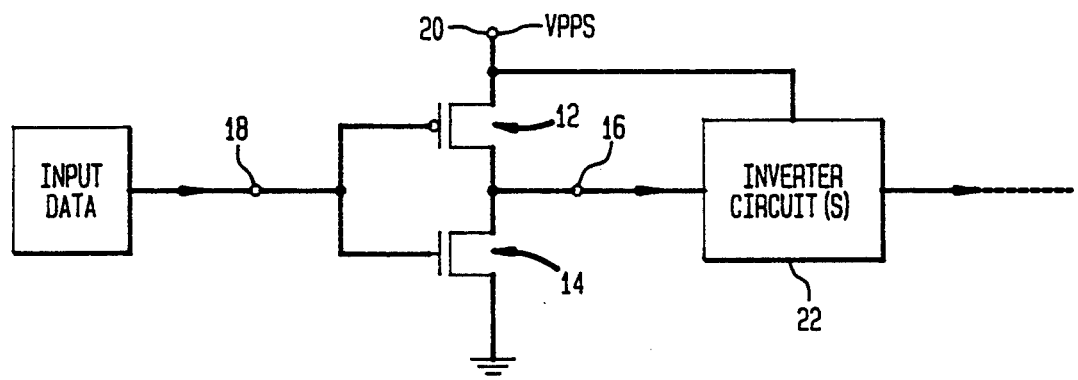
FIG. 5 is a schematic representation of a conventional CMOS inverter circuit that, in accordance with the principles of the present invention, is connected to a pulsed power supply.

FIG. 5 shows a specific illustrative CMOS inverter circuit made in accordance with the principles of the present invention. The circuit comprises two series-connected MOS transistors 12 and 14 connected between a pulsed power supply 20 and a point of refence potential such as ground. More specifically, the transistor 12 comprises a standard p-channel device and the transistor 14 comprises a standard n-channel device. Each of the devices 12 and 14 includes source, drain and gate electrodes. As shown, the drain electrodes of the two devices are connected together and to an output node or terminal designated by the reference numeral 16. The gate electrodes of the devices are connected together and to an input node or terminal 18. Further, the source electrode of the p-channel transistor 12 is connected to a pulsed power supply 20 which is designated VPPS. Lastly, the source electrode of the n-channel transistor 14 is connected to ground.

In a conventional CMOS inverter circuit, the power supply 20 shown in FIG. 5 is typically designated VDD and has a constant value such as, for example, +5 volts during the entire cycle of operation of the circuit. Additionally, the voltage connected to the source electrode of the transistor 14 in a conventional such circuit is usually designated VSS and is maintained at a point of reference potential such as ground.

In accordance with one feature of the present invention, plural inverter circuits each of the type shown in FIG. 5 are adapted to be connected together to form a string or chain of series-connected inverter circuits. Thus, for example, as indicated in FIG. 5, the output of the aforedescribed inverter circuit, which appears at the node 16, can be applied to one or more additional circuits 22 each of which is identical to the circuit described above and explicitly depicted in FIG. 5. Illustratively, each of these additional circuits has the source electrode of its respective p-channel transistor connected to the pulsed power supply 20 and the source electrode of its respective n-channel transistor connected to a point of reference potential such as ground.

For the purpose of illustrating the relatively low power consumption of a string of CMOS inverter circuits made in accordance with the principles of the present invention, assume a series-connected string of three such circuits connected to a pulsed power supply whose voltage varies repeatedly between +5 volts and ground. Assume further that the inverters are fabricated in a standard CMOS technology using 0.9-micrometer design rules and that the channel widths of the p-channel transistors are ten micrometers and the channel widths of the n-channel transistors are five micrometers. Additionally, assume that the circuits are operated at a frequency or data rate of sixteen megaHertz. In this illustrative case, the transistors dissipate about 0.199 microwatts per micrometer of channel width. Under these conditions, the power dissipated in the string would be approximately $15 \times 0.199$ or only about 2.99 microwatts.

By comparison, assume a string of three conventional CMOS inverter circuits that are identical to the aforedescribed string but which are instead powered by a constant VDD equal to +5 volts. When operating at sixteen megahertz, the inverters in such a conventional string dissipate about 1.53 microwatts per micrometer of channel width. Thus, the power dissipated in the conventional string would be $15 \times 1.53$ or about 22.95 microwatts. Significantly, this is more than seven times the power consumed by the aforespecified inventive arrangement.

Illustratively, the specific above-described inventive arrangement of three series-connected inverter circuits is capable of operation at frequencies in excess of sixteen megaHertz. Thus, for example, the arrangement can be operated up to about forty megaHertz, with a corresponding increase in power dissipation. In each case of higher-frequency operation, however, power savings are achieved relative to a conventional inverter string operating at the same frequency and powered by a constant VDD. But, of course, the conventional string is capable of operation at still higher frequencies (for example, up to about 160 megahertz). It is not generally feasible to operate the inventive string at such higher frequencies.

By way of a specific illustrative example, the timing diagram of FIG. 6 shows the waveform of the voltage provided by the power supply 20 (VPPS) of the inventive embodiment represented in FIG. 5. As indicated, VPPS varies between +5 volts and ground or 0 volts. (Variations between greater or smaller positive values and 0 are, of course, also feasible. And, as mentioned later below, variations between 0 and negative voltage values are also practicable.) Also, by way of example, VSS (the voltage connected to the source electrode of the transistor 14 of FIG. 5) is shown in FIG. 6 as always being at 0 or ground potential.

In other embodiments of the invention, it is feasible but generally less preferred to have VSS vary in a synchronized 180-degree-out-of-phase manner with respect to VPPS. The main advantage of varying VSS in that complementary way is that the conventional clock circuitry designed to supply VPPS and VSS would be thereby loaded symmetrically, which would cause the circuitry to operate in an extremely stable manner. However, the chief disadvantage of such complementary operation is that it typically dissipates more power than if VSS is simply tied to ground as represented in FIGS. 5 and 6.

FIG. 6 also shows the waveform of input signals applied to the input node 18 of the inverter circuit depicted in FIG. 5. As indicated, the voltage levels of the input signals vary between 0 and +5 volts. Herein, for illustrative purposes, a level of 0 volts will be considered representative of a binary "0" signal and a level of +5 volts will be considered representative of a binary "1" signal.

Additionally, FIG. 6 shows the waveform of output signals appearing at the output node 16 of the inverter circuit of FIG. 5. During the so-called VALID phase of the depicted pulsed mode of operation, the voltage level of the output signal is either +5 volts (a "1" signal) or 0 volts (a "0" signal). As indicated in FIG. 6, the input and output signals respectively appearing at the nodes 18 and 16 of FIG. 5 during each VALID phase are the inverse of each other. Thus, for example, during the time interval t0–t1 shown in FIG. 6, a "0" signal appears at the input node 18 while a "1" signal appears at the output node 16. Similarly, during the interval t4–t5, a "1" signal appears at the input node 18 while a "0" signal appears at the output node 16. Further, during the interval t8–t9, a "0" signal appears at the input node 18 while a "1" signal appears at the output node 16.

An illustrative full cycle of operation of the pulsed-power-supply CMOS inverter circuit shown in FIG. 5 occurs, for example, in the time interval t3–t7 shown in FIG. 6. For operation at sixteen megahertz, the extent of this interval is 62.5 nanoseconds. For the specific exemplary case in which each of the four phases of this interval has the same duration, each of the POWER-UP, VALID, POWER-DOWN and DEAD phases thus persists for 15.625 nanoseconds.

In accordance with the invention, any changes in voltage level that occur at the input node 18 are designed to take place in synchronism with changes in the waveform of VPPS. Thus, for example, the transition from a "0" to a "1" signal at the input node 18 during the time t3–t4 of FIG. 6 is controlled to occur during the POWER-UP phase of VPPS. And the "1" signal at the input node 18 is maintained for the interval t4–t5, which is the VALID phase. Subsequently, during the POWER-DOWN phase, the input signal level returns to 0 volts which is representative of a "0" signal. During the next POWER-UP phase (t7–t8), the input signal level either remains at 0 volts which indicates that the input signal during the next VALID phase (t8–t9) is to be a "0" or, if the input signal during t8–t9 is to be a "1", the input signal level would be ramped up from 0 volts to +5 volts, during the time interval t7–t8, in synchronism with the POWER-UP phase of VPPS.

During each of the POWER-UP phases depicted in FIG. 6, the voltage of the pulsed power supply VPPS increases in a ramp fashion from 0 to +5 Volts. The similarity between these ramped increases and the waveform of FIG. 4 is apparent. Due to these ramped increases, the power dissipated in the transistors 12 and 14 of FIG. 5 during turn-on is considerably less than if the power supply were abruptly increased from 0 to +5 volts in a step-wise fashion, as discussed earlier above in connection with the description of FIGS. 1 through 4.

During each DEAD phase, the voltage level of the output waveform provided by the FIG. 5 circuit is maintained at a level that is either slightly greater or less than 0 volts. Thus, for example, in the DEAD phase that occurs in the interval t2–t3 of FIG. 6, the output level that had been at a value of +5 volts during the prior VALID phase (during t0–t1) is maintained at a voltage of about +400 millivolts. This relatively low positive voltage arises from charge stored on so-called parasitic capacitances that are connected to the output node 16 of FIG. 5. These capacitances include: the capacitance of the next circuit connected to the output node, the capacitance of wiring connected to the node 16, and the capacitances of various diodes included in the CMOS structure of the inverter circuit (discussed later below).

Similarly, in the DEAD phase that occurs in the interval t6–t7 of FIG. 6, the output voltage level that had been at a value of 0 volts during the prior VALID phase (during t4–t5) is maintained at a voltage of about −100 millivolts. Again, this deviation from 0 volts arises from charge stored in the circuit on the parasitic capacitances thereof.

Thus, in each of the aforespecified DEAD phases, the depicted circuit in effect remembers, in the form of retained charge, what its last logic state had been in the immediately prior VALID phase. As indicated, a retained voltage of about +400 millivolts signifies that the last VALID output level had been representative of a "1" while a retained voltage of about −100 millivolts signifies that the last VALID output level had been a "0".

The aforementioned +400 and −100 millivolt levels stem from the ramping that occurs in the POWER-DOWN phase. During that ramping process, if the output of the inverter circuit was representative of a "1", the output voltage will follow the POWER-DOWN ramp until the p-channel transistor 12 becomes disabled. At that point, parasitic capacitance connected in parallel with the source-to-drain path of the p-channel transistor causes the output node to further decrease in voltage due to charge sharing with the load capacitance. When the potential of the POWER-DOWN ramp drops to a level that causes the parasitic diode connected in parallel with the source-to-drain path of the p-channel transistor to become forward biased, the output node follows the POWER-DOWN ramp by approximately a diode drop. But the aforedescribed capacitive coupling effect causes the output voltage of the circuit to go lower than that voltage drop. In practice, as illustratively specified herein, the output voltage approximates +400 millivolts.

Similarly, if the output of the inverter circuit was representative of a "0", the output voltage initially remains at 0 volts during POWER-DOWN due to the enabled n-channel transistor 14. When the POWER-DOWN ramp drops below the gate-to-source threshold voltage of the n-channel transistor 14, the output node is then capacitively coupled to the POWER-DOWN ramp by the aforedescribed parasitic capacitance that exists in parallel with the source-to-drain path of the p-channel transistor 12. This results in charge sharing with the load capacitance which causes the output voltage to drop below 0 volts. In practice, as specified illustratively herein, this voltage usually approximates −100 volts.

In time, the charge retained on the parasitic capacitance will leak off and the stored voltage level will approach 0. At that point, the aforedescribed memory feature of the circuit will be lost. In practice, adequate charge is retained to remember the prior state if the duration of each DEAD phase of a pulsed-power-supply cycle is controlled not to exceed about one microsecond.

The aforedescribed memory feature of the invention is important when inverter circuits are combined to form a memory cell, such as the one shown in FIG. 12 (described later below). In the case of such a cell, the stored voltage levels ensure that the cell will remember during POWER-UP the state in which it had been in the immediately prior VALID phase.

As emphasized earlier, a CMOS inverter circuit made in accordance with the principles of the present invention is identical with a conventional CMOS inverter, except that the inventive circuit is connected to a pulsed power supply. Accordingly, to conserve power, it is feasible during so-called inactive periods (for example, when no new data is being applied to the input of the circuit for extended periods of time) to connect the inventive circuit to a constant-VDD power supply. When so connected, the circuit resembles a conventional CMOS inverter in every respect. And, importantly, no power is consumed during the inactive period. Once input data signals resume, the inverter circuit is reconnected to the pulsed power supply to operate during active periods in the unique low-power manner described herein.

Figure 7:
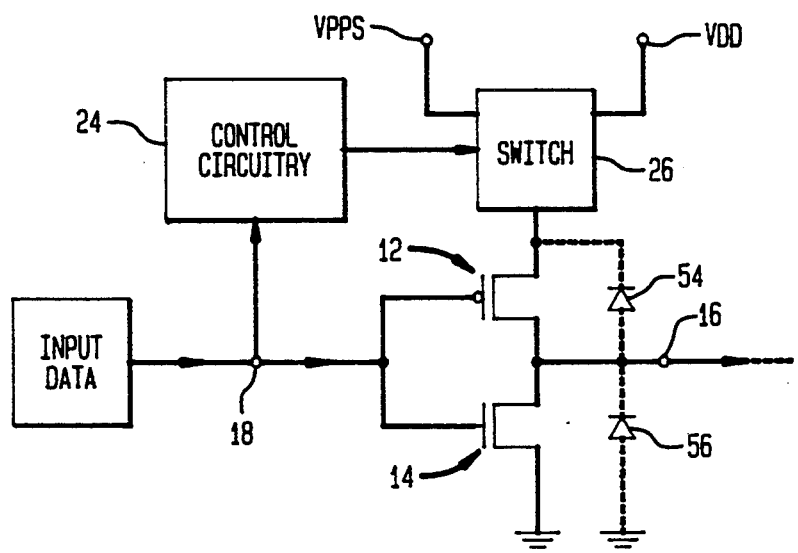
FIG. 7 shows a variant of the circuit shown in FIG. 5.

FIG. 7 schematically represents a specific illustrative embodiment made in accordance with the principles of the present invention in which a conventional CMOS inverter circuit is connected to a pulsed power supply during active data periods and to a constant-VDD power supply during inactive data periods. In the illustrative embodiment, conventional circuitry 24 connected to input node 18 is designed to supply control signals to a standard switch 26. During active periods, when data is being applied to input node 18 at at least some prespecified rate, the circuitry 24 controls the switch 26 to connect VPPS to the source electrode of the p-channel transistor 12. On the other hand, during inactive periods, the circuitry 24 controls the switch 26 to connect VDD to the source electrode of the transistor 12.

As illustratively described above, the particular swiching action represented in FIG. 7 occurs at a single gate. It is also, of course, feasible to perform this active-inactive control function for multiple gates or for an entire assembly of gates on a chip.

Figure 8:
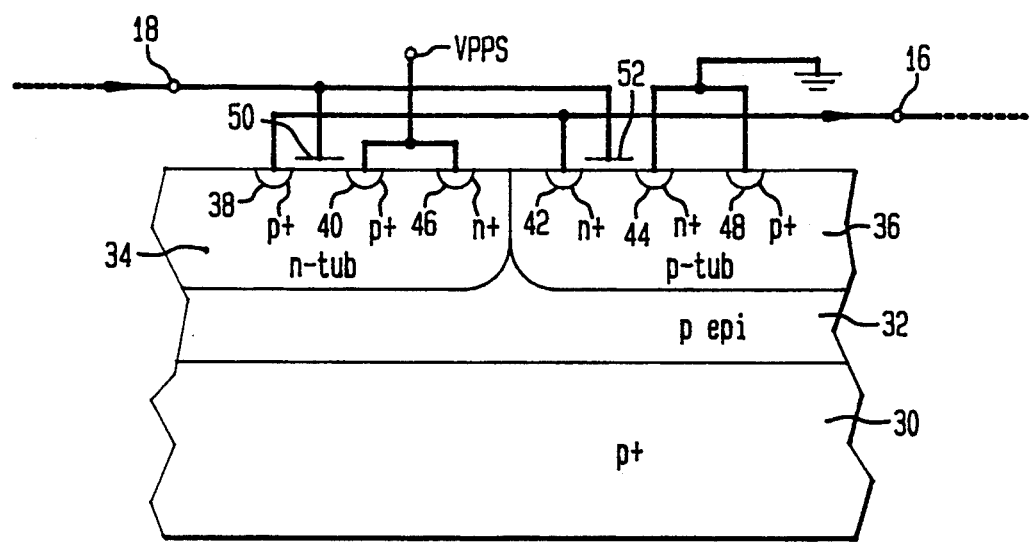
FIG. 8 is a specific illustrative showing in cross-section, not drawn to scale, of an actual realization in CMOS of the inverter circuit represented in FIG. 5.

FIG. 8 shows a portion of an actual specific illustrative CMOS implementation of the inverter circuit depicted in FIG. 5. The depiction is conventional except for the fact that the CMOS structure is shown connected to a pulsed-power-supply VPPS.

The structure shown in FIG. 8 includes a p+ substrate 30 having thereon a p-type epitaxial layer 32 in which n- and p-type tubs 34 and 36, respectively, are formed. In turn, p+-type drain and source regions 38 and 40, respectively, are formed in the n-tub 34, and n+-type drain and source regions 42 and 44, respectively, are formed in the p-tub 36. An n+ region 46 is utilized to make contact to the n-tub 34 while a p+ region 48 is employed to make contact to the p-tub 36.

Also, gate electrodes 50 and 52 are schematically depicted in FIG. 8. In a standard way, the gate electrode 50 is disposed in close proximity to the p+ source and drain regions 38 and 40 in the n-tub 34, while the gate electrode 52 is disposed in close proximity with the n+ source and drain regions in the p-tub 36. Further, the gate electrodes 50 and 52 are connected together and to input node 18. Moreover, the drain regions 38 and 42 are shown connected together and to output node 16. Additionally, the source region 40 and the n+ region 46 are connected together and to VPPS, while the source region 44 and the p+ region 48 are connected together and to ground.

Various diode structures inherently exist in the CMOS implementation depicted in FIG. 7. Thus, for example, a diode formed by the p+ region 38 and the n-tub 34 exists in parallel with the source-to-drain path of the transistor defined in the n-tub 34, while a diode formed by the n+ region 42 and the p-tub 36 exists in parallel with the source-to-drain path of the transistor defined in the p-tub 36. These diodes, which are represented by dash lines in the circuit diagram of FIG. 7 and designated therein by reference numerals 54 and 56, comprise part of the parasitic capacitance described earlier above as being connected to the output node 16.

In accordance with the present invention, a variety of low-power-dissipation logic circuitry connected to a pulsed power supply is feasible. Illustratively, such circuitry is realized by connecting additional conventional p- or n-channel MOS transistors in parallel and/or in series with the transistors that constitute the inverter circuit described above and shown in FIGS. 5 and 7.

Figure 9:
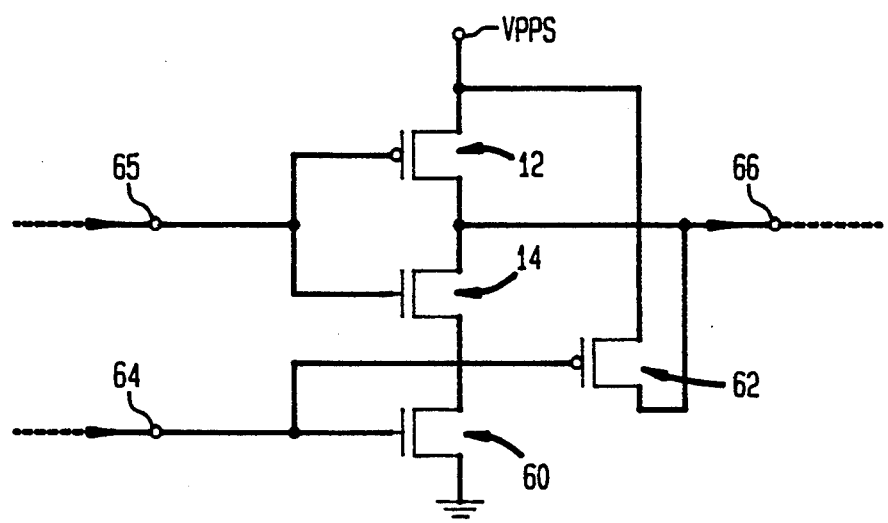
FIG. 9 schematically depicts a NAND circuit, including a FIG. 1-type inverter circuit, made in accordance with the principles of the present invention.

Thus, for example, NAND circuitry is shown in FIG. 9. The depicted circuitry includes transistors 12 and 14 connected together in essentially the same manner as in the previously described inverter circuit. Additionally, the source-to-drain path of n-channel transistor 60 is connected in series with the units 12 and 14, and the source-to-drain path of p-channel transistor 62 is connected in parallel with the transistor 12. Further, the gate electrodes of the additional transistors 60 and 62 are connected together and to input node 64, while the gate electrodes of the transistors 12 and 14 are connected together and to input node 65. The output of the depicted NAND circuitry appears at node 66. And the entire circuitry, which performs a standard NAND logic operation, is connected to pulsed power supply VPPS.

Figure 10:
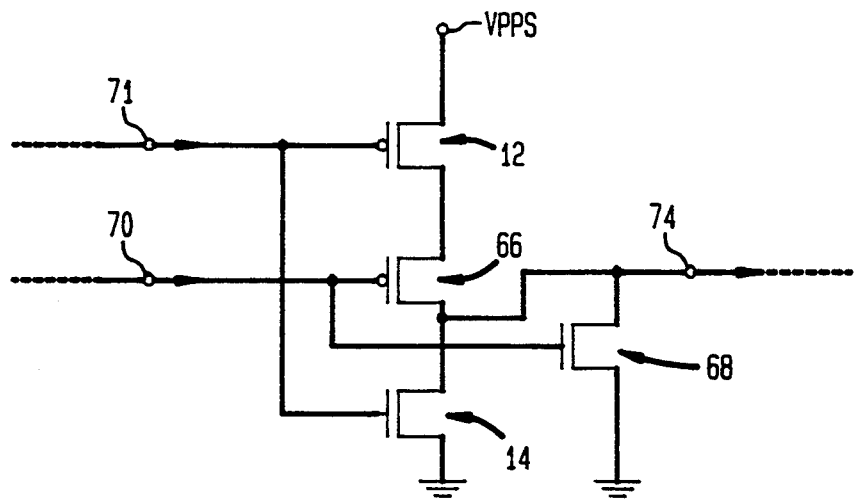
FIG. 10 is a schematic showing of a NOR circuit, including a FIG. 1-type inverter circuiy, made in accordance with the present invention.

FIG. 10 shows NOR circuitry which includes transistors 12 and 14 connected together in essentially the same manner as in the previously described inverter circuit. Additionally, the source-to-drain path of p-channel transistor 66 is connected between and in series with the transistors 12 and 14, and the source-to-drain path of n-channel transistor 68 is connected in parallel with the transistor 14. Further, the gate electrodes of the additional transistors 66 and 68 are connected together and to input node 70, while the gate electrodes of the transistors 12 and 14 are connected together and to input node 72. The output of the depicted NOR circuitry appears at node 74. And the entire circuitry, which performs a standard NOR logic operation, is connected to pulsed power supply VPPS.

Figure 11:
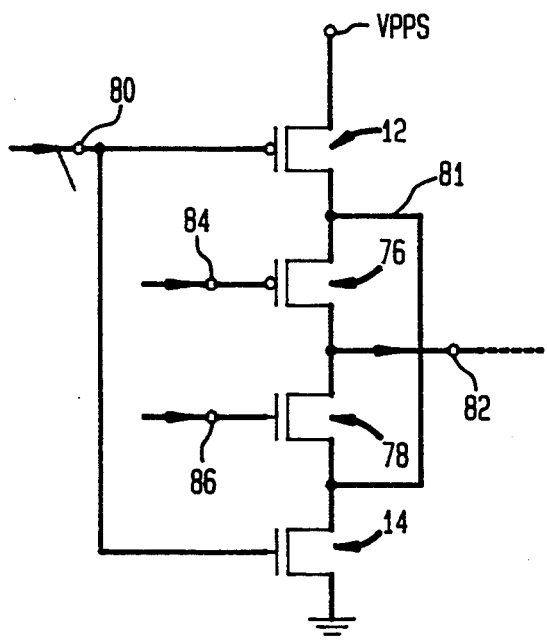
FIG. 11 is a schematic showing of a gated inverter circuit, including a FIG. 1-type. inverter circuit, made in accordance with the present invention.

Another illustrative example of circuitry that in effect includes the aforedescribed inverter circuit as a component thereof and that is connected to a pulsed power supply is shown in FIG. 11. The depicted circuitry, which constitutes a gated inverter circuit, includes transistors 12 and 14 connected together in essentially the same manner as in the previously described inverter circuit. Additionally, the source-to-drain paths of p-channel transistor 76 and n-channel transistor 78 are connected together in series with the source-to-drain paths of the units 12 and 14. As before, the gate electrodes of the transistors 12 and 14 are connected together and to an input node which in FIG. 11 is designated by reference numeral 80. Further, lead 81 is connected as shown in parallel with the series-connected source-to-drain paths of the transistors 76 and 78.

The output of the arrangement shown in FIG. 11 appears at output node 82. If the signals applied to control input nodes 84 and 86 are "0" and "1", respectively, the signal that appears at the output node 82 is the inverse of the signal applied to the input node 80. On the other hand, if the signals applied to the control nodes 84 and 86 are "1" and "0", respectively, the signal at the output node 82 remains invariant despite any change in signal level that occurs at the input node 80.

Furthermore, the basic inverter circuit described herein can be utilized to form memory arrangements suitable for operation from a pulsed power supply. By way of example, two such inverter circuits can be cross-connected, in the particular manner shown in FIG. 12, to form a memory cell. By combining such cells with logic circuitry of the illustrative type specified earlier above, it is possible to form a wide variety of combinational and sequential circuit arrangements all operated in a low-power manner from a pulsed power supply.

Figure 12:
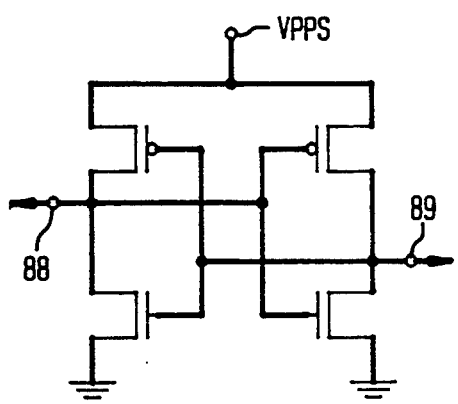
FIG. 12 schematically represents a memory circuit, including two cross-connected inverter circuits each of the type shown in FIG. 1, which embodies the principles of the invention.

In FIG. 12, a voltage level representative of either a "0" or a "1" appears at output node 88 during the VALID phase of each cycle of the pulsed power supply. During the same time period, a voltage level representative of the complement of the signal at the node 88 appears at output node 89. During each DEAD phase of the cycle of operation, information is retained in the cell in the form of charge stored on the aforedescribed parasitic capacitances that are included in the circuitry. Thus, for example, for one state of the depicted cell, a binary digit would be stored in the parasitic capacitances during each DEAD phase as +400 millivolts at the node 88 and as −100 millivolts at the node 89. For the other binary state, the retained or residual voltage levels at these nodes would be respectively reversed.

Finally, it is to be understood that the above-described arrangements are only illustrative of the principles of the present invention. In accordance with these principles, numerous modifications and alternatives may be devised by those skilled in the art without departing from the spirit and scope of the invention. Thus, for example, it is generally advantageous to provide a symmetrical VPPS waveform of the type represented in FIG. 6. Such a waveform is easily derived in standard ways from a sinusoidal waveform. But, alternatively, it is feasible and sometimes desirable to provide an asymmetrical VPPS waveform. In such an asymmetrical waveform, the respective durations of the POWER-UP, VALID, POWER-DOWN and DEAD phases are not the same. In that way, the speed of operation of a particular pulsed-power-supply arrangement can be optimized while preserving its advantageous low-power dissipation characteristics. Or, for a particular speed of operation, the power-dissipation characteristic of the arrangement can be minimized by resorting to an asymmetrical VPPS. Also, while emphasis herein has been directed to a VPPS waveform that varies between a positive voltage and a point of reference potential, it is also feasible to implement an inverter circuit in a CMOS structure based on an $n^+$ substrate which would operate from a VPPS waveform that repeatedly varies between a negative voltage level and a point of reference potential.

Further, other arrangements such as OR-AND-INVERT (OAI) circuits, AND-OR-INVERT (AOI) circuits, EXCLUSIVE-OR circuits, latches and flip-flops that each include the herein-described inverter circuit as a basic component part are feasible. By connecting such arrangements to a pulsed power supply, low-power-dissipation operation thereof is achieved.

What is claimed is:

1. A CMOS circuit comprising
  a p-channel transistor having source, drain and gate electrodes,
  an n-channel transistor having source, drain and gate electrodes,
  first means connecting said gate electrodes together,
  second means connecting said drain electrodes together,
  an input terminal directly connected to said first connecting means,
  means for applying to said input terminal an input waveform representative of binary data signals,
  an output terminal connected to said second connecting means,
  and means connecting at least one of said source electrodes to a pulsed power supply having a waveform that is in phase with said input waveform.

2. A CMOS circuit comprising
  a p-channel transistor having source, drain and gate electrodes,
  an n-channel transistor having source, drain and gate electrodes,
  first means connecting said gate electrodes together,
  second means connecting said drain electrodes together,
  an input terminal connected to said first connecting means,
  an output terminal connected to said second connecting means,
  means connecting at least one of said source electrodes to a pulsed power supply,
  means for applying input data signals to said input terminal,
  a constant-value power supply,
  and means responsive to data signals being actively supplied by said input data applying means for connecting at least one of the source electrodes to the pulsed power supply and responsive to data not being actively applied by said input data applying means for connecting said at least one of the source electrodes to the constant-value power supply.

3. A circuit as in claim 1 wherein one of said source electrodes is connected to a pulsed power supply and the other one of said source electrodes is connected to a point of reference potential.

4. A circuit as in claim 3 wherein said pulsed power supply provides a repetitive four-phase waveform characterized by POWER-UP, VALID, POWER-DOWN and DEAD phases, wherein said VALID and DEAD phases are characterized by voltage levels that are respectively representative of binary signals in the circuit, and said POWER-UP and POWER-DOWN phases are characterized by ramped voltage transitions between said DEAD and VALID phases.

5. A circuit as in claim 4 further including
an additional n-channel transistor having source, drain and gate electrodes,
means connecting the source-to-drain path of said additional transistor in series between the source electrode of said first-mentioned n-channel transistor and said point of reference potential,
an additional p-channel transistor having source, drain and gate electrodes,
means connecting the source-to-drain path of said additional p-channel transistor in parallel with the source-to-drain path of said first-mentioned p-channel transistor,
third means connecting the gate electrodes of said additional transistors together,
and an additional input terminal connected to said third connecting means,
whereby signals appearing at said output terminal are representative of the NAND logic function of signals applied to said input terminals.

6. A circuit as in claim 4 further including
an additional p-channel transistor having source, drain and gate electrodes,
means connecting the source-to-drain path of said additional transistor in series between the drain electrodes of said first-mentioned p-channel transistor and said n-channel transistor such that said output terminal remains connected to the drain electrode of said n-channel transistor,
an additional n-channel transistor having source, drain and gate electrodes,
means connecting the source-to-drain path of said additional n-channel transistor in parallel with the source-to-drain path of said first-mentioned n-channel transistor,
and an additional input terminal connected to said third connecting means,
whereby signals appearing at said output terminal are representative of the NOR logic function of signals applied to said input terminals.

7. A circuit as in claim 4 further including
an additional p-channel transistor and an additional n-channel transistor each having source, drain and gate electrodes,
means connecting the source-to-drain path of said additional p-channel transistor in series between the drain of said first-mentioned p-channel transistor and said output terminal,
means connecting the source-to-drain path of said additional n-channel transistor in series between the drain of said first-mentioned n-channel transistor and said output terminal,
a direct electrical connection extending between the drains of said first-mentioned p- and n-channel transistors,
and additional input terminals respectively connected to the gate electrodes of said additional transistors, whereby complementary binary signals respectively applied to said additional input terminals are determinative of whether or not signals applied to said first-mentioned input terminal are gated to said output terminal.

8. A circuit as in claim 4 further including
an additional p-channel transistor having source, drain and gate electrodes,
an additional n-channel transistor having source, drain and gate electrodes,
third means connecting the gate electrodes of said additional transistors together,
fourth means connecting the drain electrodes of said additional transistors together,
an additional output terminal connected to said fourth connecting means,
fifth means connecting said additional output terminal to said input terminal,
sixth means connecting said third connecting means to said first-mentioned output terminal,
and means connecting at least one of the source electrodes of said additional transistors to said pulsed power supply, whereby complementary binary signals respectively appear at said output terminals indicative of whether or not said circuit is storing a "0" or a "1" representation.

* * * * *